(12) United States Patent
Matsuda

(10) Patent No.: US 7,332,380 B2
(45) Date of Patent: Feb. 19, 2008

(54) PATTERN DESIGN METHOD AND PROGRAM OF A SEMICONDUCTOR DEVICE INCLUDING DUMMY PATTERNS

(75) Inventor: Satoshi Matsuda, Oita-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 165 days.

(21) Appl. No.: 11/207,180

(22) Filed: Aug. 19, 2005

(65) Prior Publication Data

US 2006/0094190 A1    May 4, 2006

(30) Foreign Application Priority Data

Aug. 20, 2004    (JP) ............................. 2004-240910

(51) Int. Cl.
*H01L 21/332* (2006.01)
(52) U.S. Cl. .............................. 438/140; 716/4; 716/5; 716/21
(58) Field of Classification Search ................ 438/140; 716/5, 21, 4
See application file for complete search history.

(56) References Cited

U.S. PATENT DOCUMENTS

| | | | | |
|---|---|---|---|---|
| 6,901,577 | B2* | 5/2005 | Kotani et al. .................. | 716/21 |
| 7,154,164 | B2* | 12/2006 | Uchiyama et al. ........... | 257/620 |
| 2002/0157076 | A1* | 10/2002 | Asakawa ...................... | 716/10 |
| 2003/0056191 | A1* | 3/2003 | Chen et al. .................... | 716/21 |
| 2005/0110065 | A1* | 5/2005 | Uchiyama et al. ........... | 257/296 |
| 2005/0160381 | A1* | 7/2005 | Idani et al. .................... | 716/1 |
| 2005/0160393 | A1* | 7/2005 | Kobayashi .................... | 716/19 |
| 2005/0172248 | A1* | 8/2005 | Shimada et al. .............. | 716/5 |
| 2005/0193364 | A1* | 9/2005 | Kotani et al. ................. | 716/21 |

FOREIGN PATENT DOCUMENTS

JP    2003-243510 A    8/2003

* cited by examiner

*Primary Examiner*—Thao P. Le
(74) *Attorney, Agent, or Firm*—Foley & Lardner LLP

(57) ABSTRACT

According to an aspect of the present invention, there is provided a pattern design method of a semiconductor device, including preparing design pattern data, separating a pattern region of a semiconductor device on the basis of the design pattern data into a dummy pattern region and a dummy pattern prohibition region, dividing the dummy pattern region into dummy pattern unit regions, setting a plurality of inspection areas in the dummy pattern region and the dummy pattern prohibition region, the inspection area closing round at least the two or more dummy pattern unit regions, a part of the one dummy pattern unit region overlapping a part of another dummy pattern unit region, calculating a tentative pattern-covering fraction of a dummy pattern, the dummy pattern being formed of the dummy pattern unit region in the inspection area, calculating a final pattern-covering fraction of the dummy pattern unit region, the final pattern-covering fraction being obtained by averaging the tentative pattern-covering fraction of the dummy pattern unit region in the inspection area, and generating the dummy pattern in the dummy pattern unit region on the basis of the final pattern-covering fraction calculated on the dummy pattern unit region.

16 Claims, 15 Drawing Sheets

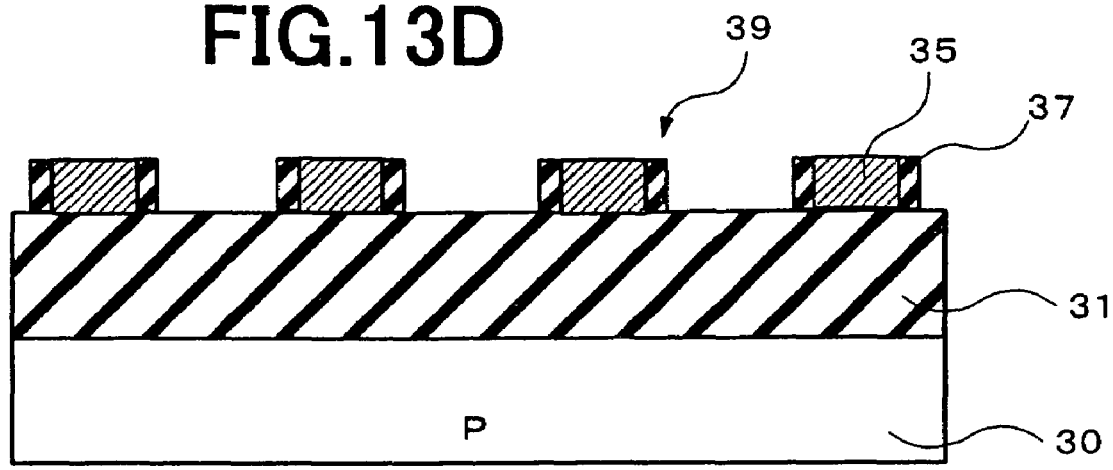
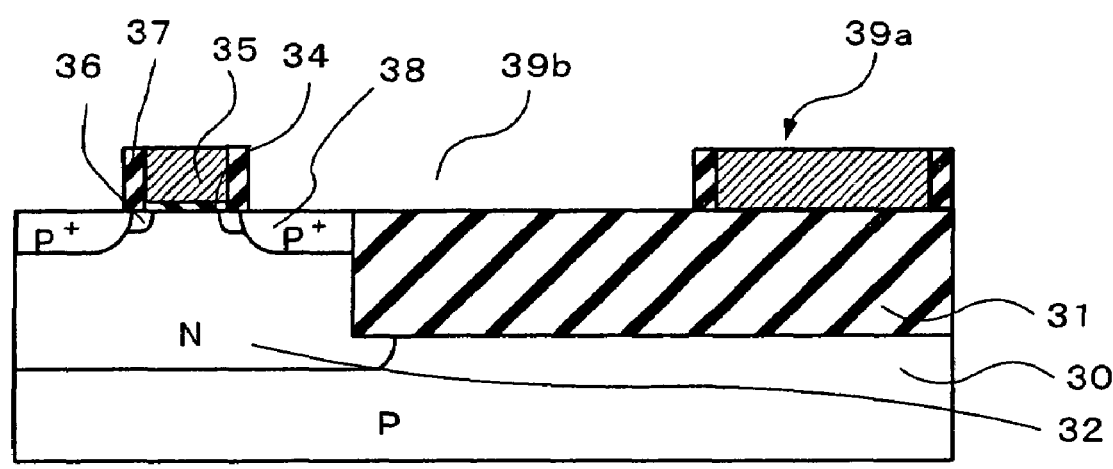

PATTERN DESIGN METHOD AND PROGRAM OF A SEMICONDUCTOR DEVICE INCLUDING DUMMY PATTERNS

CROSS REFERENCE TO RELATED APPLICATION

This application is based upon and claims the benefit of priority from the prior Japanese Patent Application No. 2004-240910, filed Aug. 20, 2004, the entire contents of which are incorporated herein by reference.

FIELD OF THE INVENTION

The present invention relates to a semiconductor device, a pattern design method of the semiconductor device and program for the pattern design method, in particular, relates to designing a dummy pattern layout on a semiconductor device.

DESCRIPTION OF THE BACKGROUND

In view of the needs of the circuit design, element characteristics and the like, the patterns of elements, wirings, electrodes, and the like, which form semiconductor devices, are arranged. Accordingly, a fraction (pattern-covering fraction) indicating how much area of the plane region of the semiconductor device is occupied by these pattern areas differs depending on each semiconductor device. Moreover, these pattern areas also differ in the plane region of the semiconductor device in many cases.

When the pattern-covering fraction differs in the plane region of the semiconductor device, the following problems occur in the semiconductor manufacturing processes. For example, when insulating gate field effect transistors (MOSFETs) are arranged as elements in a logic circuit or the like, the space between MOSFETs is relatively increased to form a large element isolation region.

In such a case, in the manufacturing process, burying an insulating layer between wirings by use of, for example, chemical mechanical polishing process or the like, may cause a phenomenon in which a relatively large insulating layer isolation region is deeply polished, and may cause a reduction in yield. Moreover, the pattern-covering fraction in the vicinity of the pattern differs in fine patterning processes such as lithography, relative ion etching, and the like, causing a possibility that non-uniformity in the size and the shape may occur.

In order to avoid such problems, there is used a method in which a dummy pattern having no function as an element in addition to an actual pattern which is originally necessary for an element, is formed to make the pattern-covering fraction uniform in a mask pattern design. For forming the dummy pattern, the following process is known. First, the dummy pattern prohibition region is formed on a portion where the actual pattern already exists or in the vicinity thereof. Sequentially, the dummy pattern is arranged on a dummy pattern region to make the pattern-covering fraction uniform.

With miniaturization of the element, more precise control on uniformity such as film thickening of a thin film in the semiconductor device is required in manufacturing processes. However, in the conventional dummy pattern forming method, the uniform pattern-covering fraction is required over the entire dummy pattern region, causing a problem in which the pattern-covering fraction in the vicinity of the dummy pattern prohibition region is reduced to make it impossible to form a dummy pattern having a pattern-covering fraction with high uniformity. This causes non-uniformity in the size and the shape for example.

SUMMARY OF INVENTION

According to an aspect of the present invention, there is provided a pattern design method of a semiconductor device, including preparing design pattern data, separating a pattern region of a semiconductor device on the basis of the design pattern data into a dummy pattern region and a dummy pattern prohibition region, dividing the dummy pattern region into dummy pattern unit regions, setting a plurality of inspection areas in the dummy pattern region and the dummy pattern prohibition region, the inspection area closing round at least the two or more dummy pattern unit regions, a part of the one dummy pattern unit region overlapping a part of another dummy pattern unit region, calculating a tentative pattern-covering fraction of a dummy pattern, the dummy pattern being formed of the dummy pattern unit region in the inspection area, calculating a final pattern-covering fraction of the dummy pattern unit region, the final pattern-covering fraction being obtained by averaging the tentative pattern-covering fraction of the dummy pattern unit region in the inspection area, and generating the dummy pattern in the dummy pattern unit region on the basis of the final pattern-covering fraction calculated on the dummy pattern unit region.

Further, another aspect of the invention, there is provided a program for a pattern design of a semiconductor device, including preparing design pattern data, separating a pattern region of a semiconductor device on the basis of the design pattern data into a dummy pattern region and a dummy pattern prohibition region, dividing the dummy pattern region into dummy pattern unit regions, setting a plurality of inspection areas in the dummy pattern region and the dummy pattern prohibition region, the inspection area closing round at least the two or more dummy pattern unit regions, a part of the one dummy pattern unit region overlapping a part of another dummy pattern unit region, calculating a tentative pattern-covering fraction of a dummy pattern, the dummy pattern being formed of the dummy pattern unit region in the inspection area, calculating a final pattern-covering fraction of the dummy pattern unit region, the final pattern-covering fraction being obtained by averaging the tentative pattern-covering fraction of the dummy pattern unit region in the inspection area, and generating the dummy pattern in the dummy pattern unit region on the basis of the final pattern-covering fraction calculated on the dummy pattern unit region.

Further, another aspect of the invention, there is provided a semiconductor device, including a dummy pattern prohibition region including a real pattern acting as an element, a dummy pattern region being outside the dummy pattern prohibition region and including a dummy pattern non-acting as an element, an area of the dummy pattern formed in a plurality of dummy pattern unit regions being divided in the dummy pattern region being the largest in the dummy pattern region neighboring the dummy pattern prohibition region and the area of the dummy pattern decreasing with the dummy pattern separating a distance against the dummy pattern prohibition region.

BRIEF DESCRIPTION OF THE DRAWINGS

FIGS. 13A-13G show cross-sectional views showing a method of manufacturing a semiconductor device according to a third embodiment of the present invention.

DETAILED DESCRIPTION OF THE INVENTION

The following will explain embodiments of the present invention with reference to drawings.

FIRST EMBODIMENT

A first embodiment is an integrated circuit using MOS-FETs as semiconductor devices. An explanation will be given of a method of designing a pattern with a dummy pattern taking a gate electrode layer as an example of a pattern layer.

Figure 1:
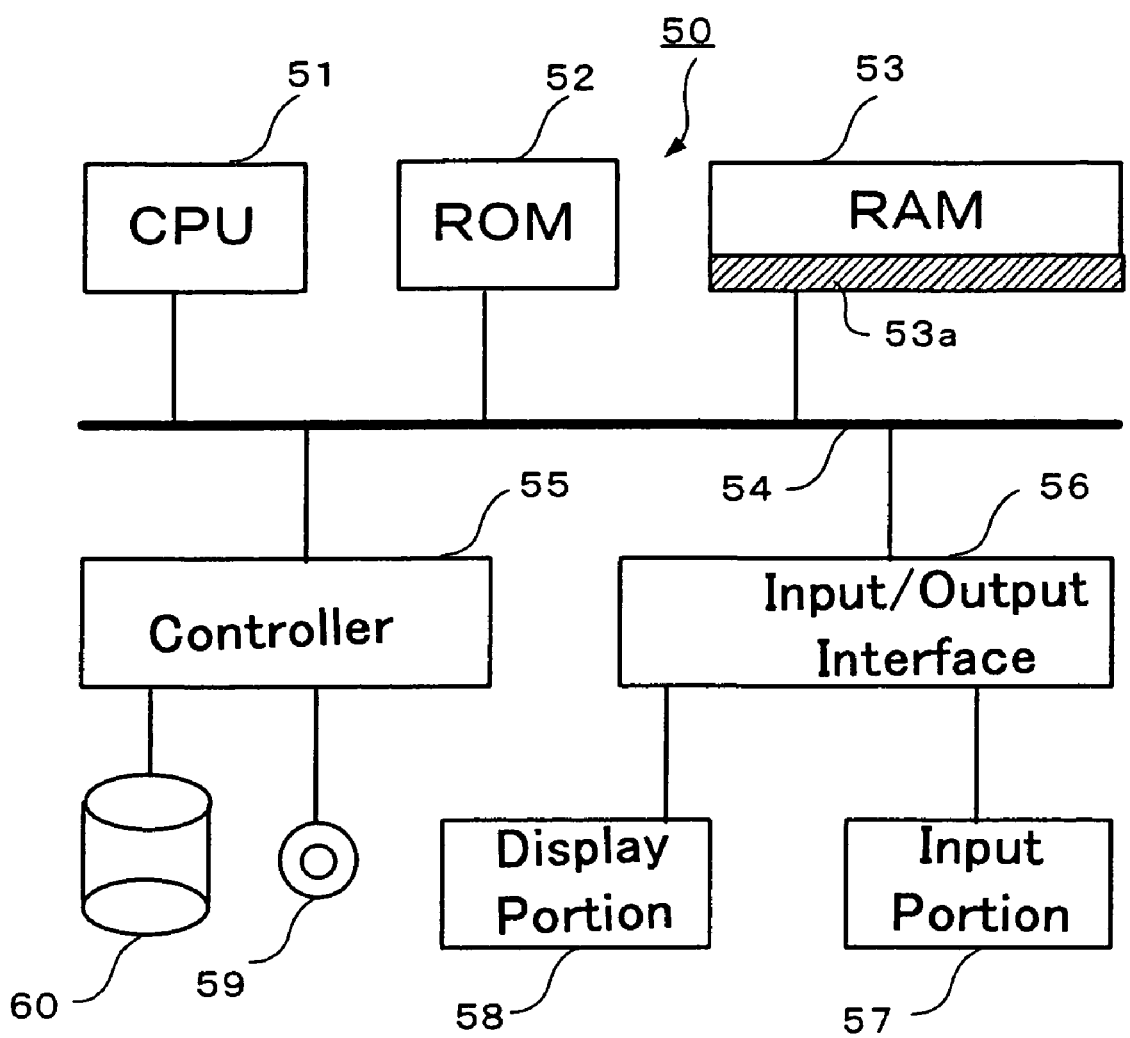
FIG. 1 shows a block diagram showing a pattern design apparatus using a semiconductor device according to a first embodiment of the present invention.

FIG. 1 is a block diagram illustrating one example of a pattern design apparatus used in executing a pattern design method for the semiconductor device according to the present invention. A pattern design program 53a, which is a computer program for carrying out pattern design of the semiconductor device, is first stored in any of storage media such as a ROM 52, a CD 59 and a disk 60 as a hard disk in a pattern design apparatus 50. The computer program stored in any of the ROM 52, the CD 52, the disk 60 or the like is passed through a bus line 54 via a controller 55 and loaded into a RAM 53. A CPU 51 executes the pattern design program 53a loaded into the RAM 53 and requests data such as a necessary parameter via an input-output interface 56 from a keyboard or a mouse as an external input portion 57. Moreover, the CPU 51 causes a display portion 58 to display design data, design drawings and etc.

Figure 2:
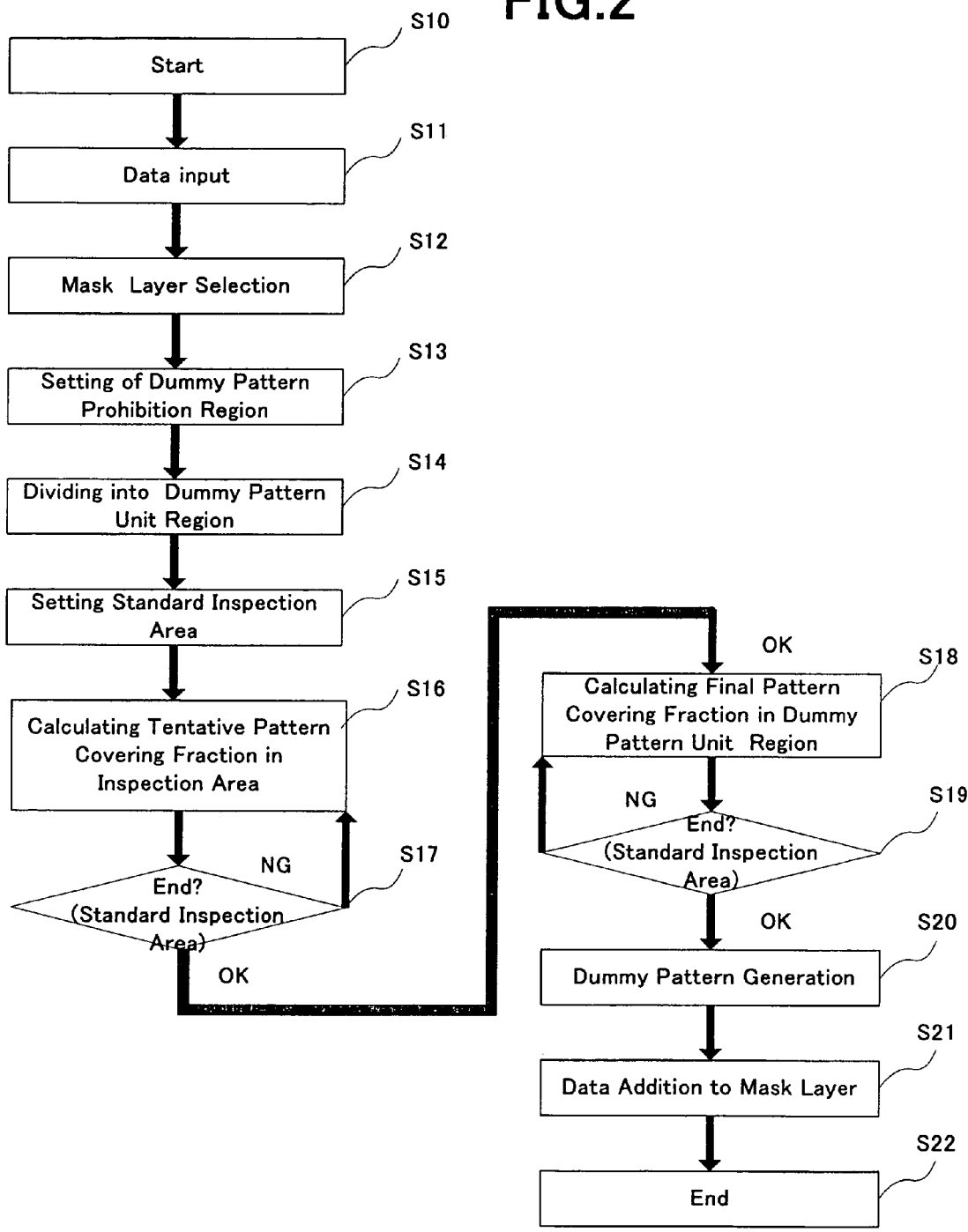
FIG. 2 shows a flow chart showing a pattern design method of the semiconductor device according to the first embodiment of the present invention.

FIG. 2 is a flowchart illustrating steps of the pattern design according to the present embodiment. In the present embodiment, after an operation is started (S10), deign data obtained when element layout design in the integrated circuit is ended is input into a storing portion such as the disk 60 in the aforementioned pattern design apparatus (S11).

Figure 4:
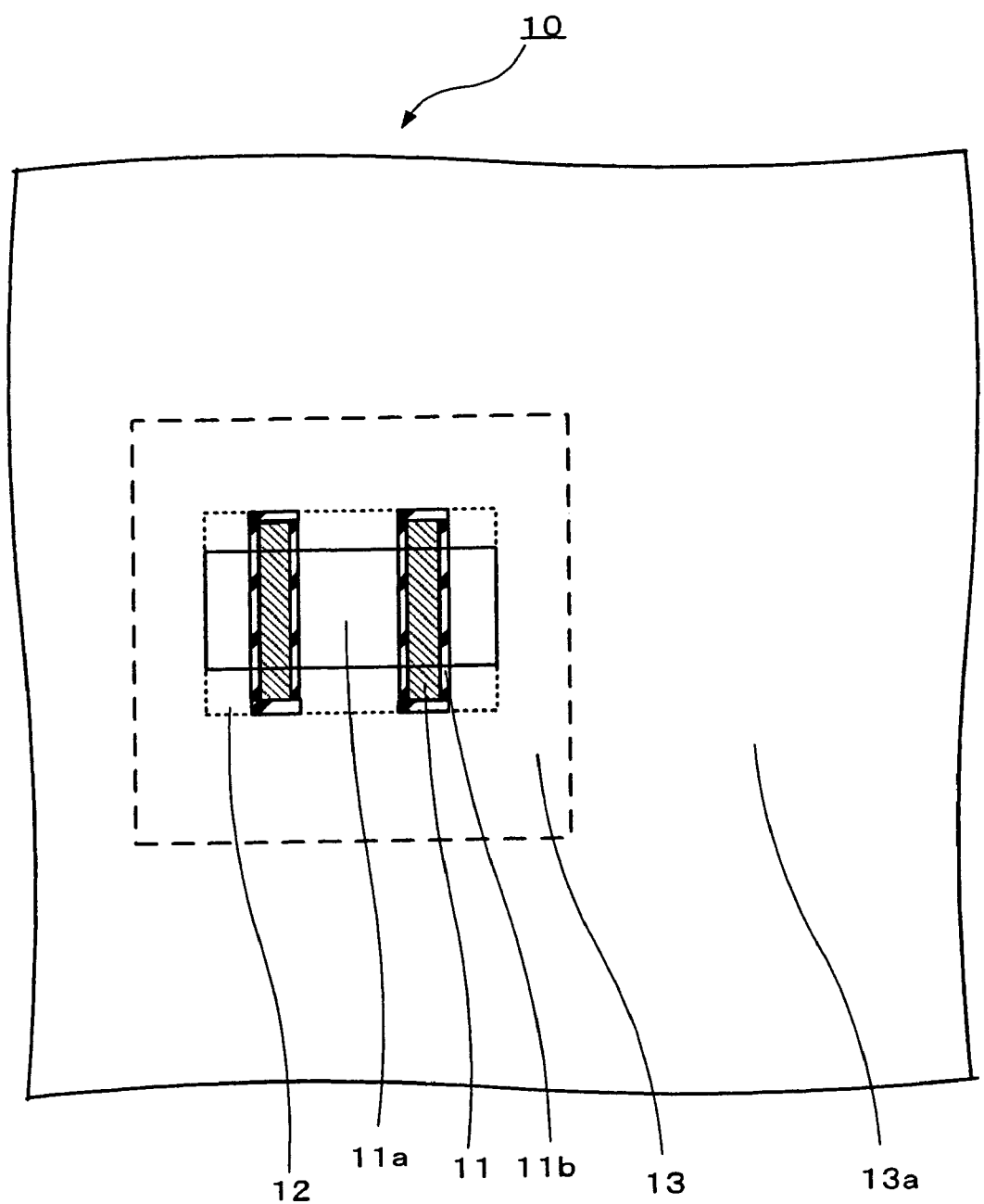
FIG. 4 shows a plane view showing a pattern construction of the semiconductor device according to the first embodiment of the present invention.

Sequentially, under control of the CPU 51, the data input into the pattern design apparatus is read from the memory portion and displayed on the display portion 58, and a mask layer to which the dummy pattern is inserted is selected through the input portion 57 (S12). In the present embodiment, the gate electrode layer in the MOS transistor is selected. FIG. 4 is a schematic plan view of a semiconductor device 10 illustrating a part of a pattern in which the MOS transistor as an element is laid out after the element layout design in the integrated circuit is ended.

A pattern of a MOS transistor region 12 is formed in such a manner that gate electrodes 11 are surrounded by a side-wall insulating film 11b and a source-drain region 11a is formed to sandwich the gate electrodes 11. In this pattern, only the pattern of the gate electrodes 11 is formed in the gate electrode layer and the patterns of the side-wall insulating film 11b and the source-drain region 11a are formed in another mask layer.

In the pattern design method of the present embodiment, in order to avoid interaction between the element and the dummy pattern, a dummy pattern prohibition region 13 is formed to keep a predetermined distance from the MOS transistor region 12 and to surround the MOS transistor region 12 and a region other than the dummy pattern prohibition region 13 is set as a dummy pattern region 13a (S13)

Figure 5:
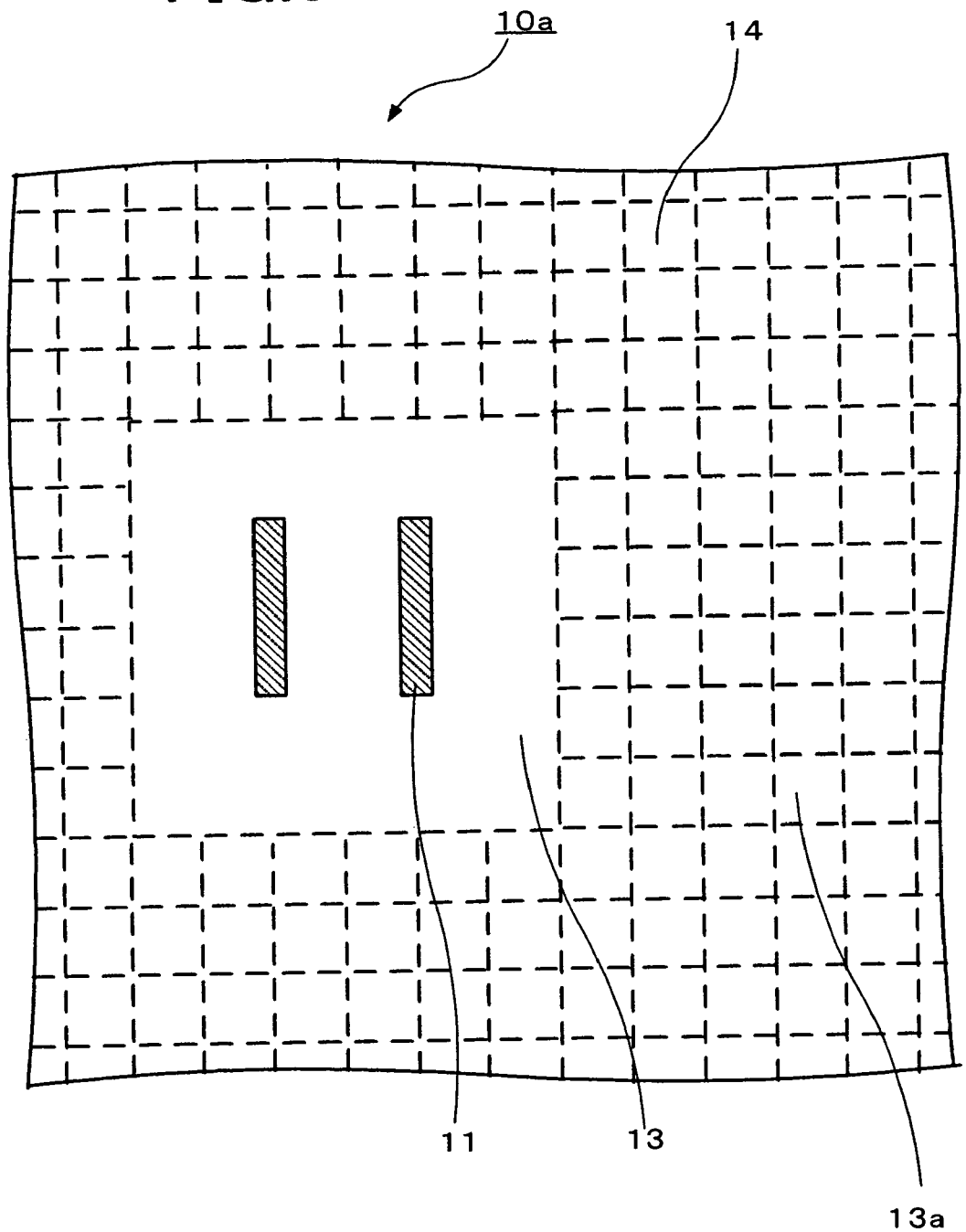
FIG. 5 shows a plane view showing the pattern design method of the semiconductor device according to the first embodiment of the present invention.

Next, the CPU 51 controls the pattern design apparatus based on the pattern design program 53a and divides the dummy pattern region 13a, that is the region excepting the dummy pattern prohibition region 13 with the gate electrodes 11 formed in the gate electrode layer 10a, into a plurality of dummy pattern unit regions 14 as illustrated in the schematic plan view of the gate electrode layer in FIG. 5 (S14). Though the dummy pattern unit regions 14 basically have the same shape, e.g., squares, and the same area, different shapes and areas may be included therein. As described later, a dummy pattern is formed in the dummy pattern unit region 14.

Figure 6:
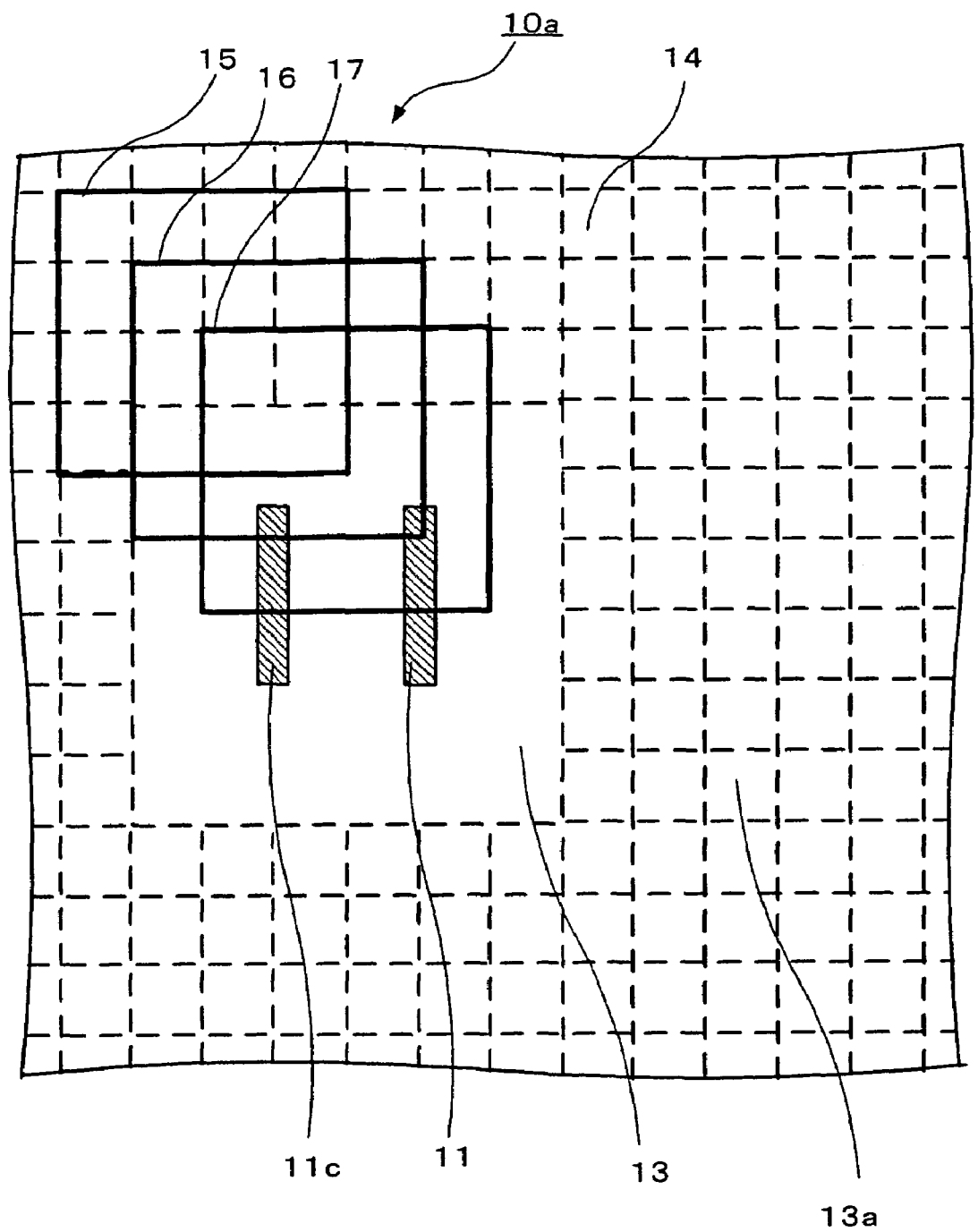
FIG. 6 shows a plane view showing the pattern design method of the semiconductor device according to the first embodiment of the present invention.

Sequentially, under control of the CPU 51, inspection areas 15 to 17, each having a size such that at least two or more multiple dummy pattern unit regions 14 are surrounded, are determined as illustrated in FIG. 6. FIG. 6 illustrates only the first inspection area 15, the second inspection area 16 and the third inspection area 17 as the example of the inspection areas. These inspection areas are, however, overlapped with one another and extend to the entire surface of the gate electrode layer 10a as shown by the first inspection area 15, the second inspection area 16 and the third inspection area 17.

Figure 7:
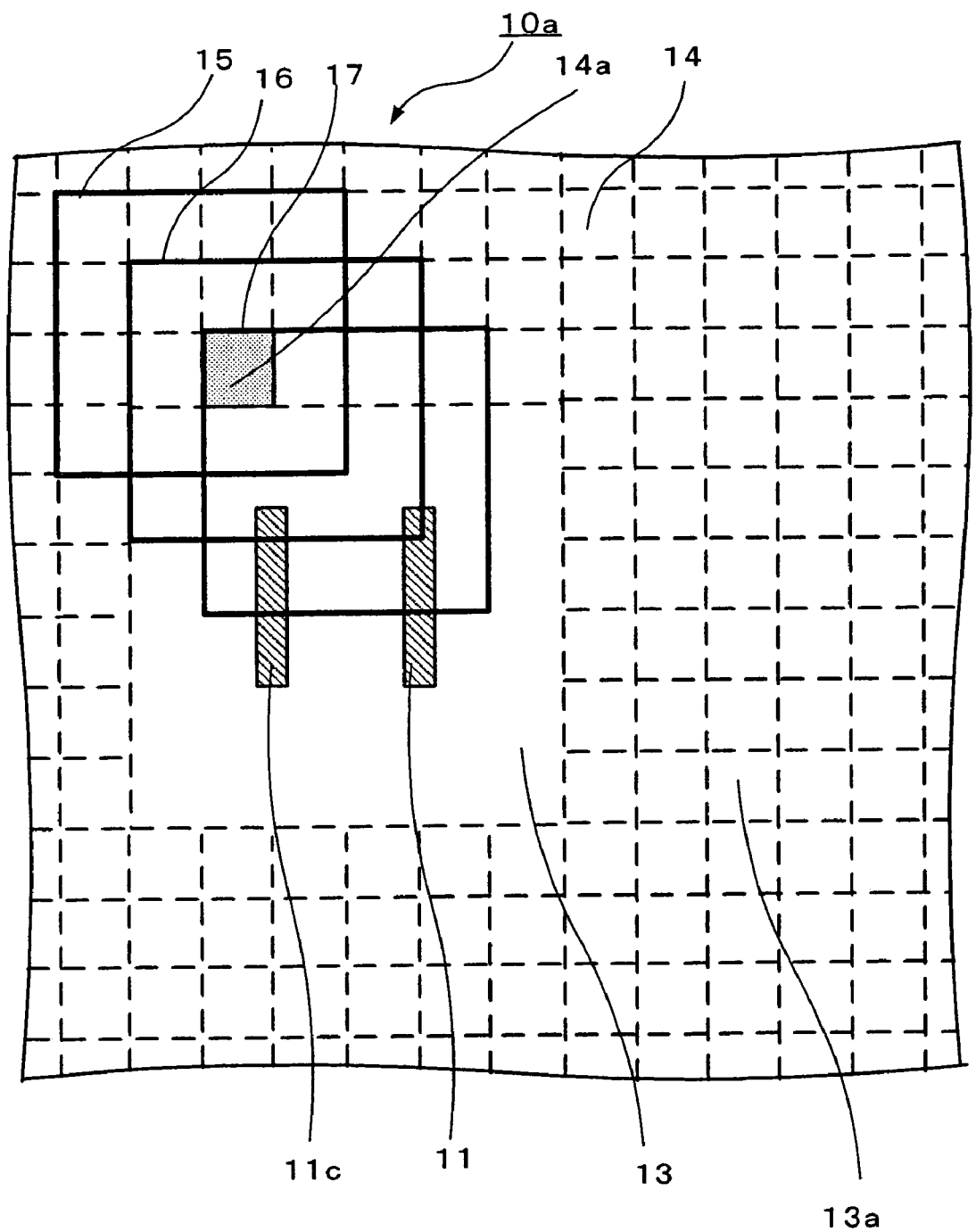
FIG. 7 shows a plane view showing the pattern design method of the semiconductor device according to the first embodiment of the present invention.

Moreover, as illustrated by the first inspection area 15, the inspection area covers the multiple dummy pattern unit regions 14, and includes, for example, a part of the dummy pattern prohibition region 13 in some cases. While, as illustrated in FIG. 7, for example, a dummy pattern unit region 14a is covered with each of the first inspection area 15, the second inspection area 16, and the third inspection area 17.

Next, the CPU 51 calculates a tentative pattern-covering fraction, which is the pattern-covering fraction of the dummy pattern unit regions 14 within the inspection area for each of the inspection areas 15 to 17 (S16). The calculation of the tentative pattern-covering fraction is repeated until the calculations of all inspection areas are ended (S17).

Figure 3:
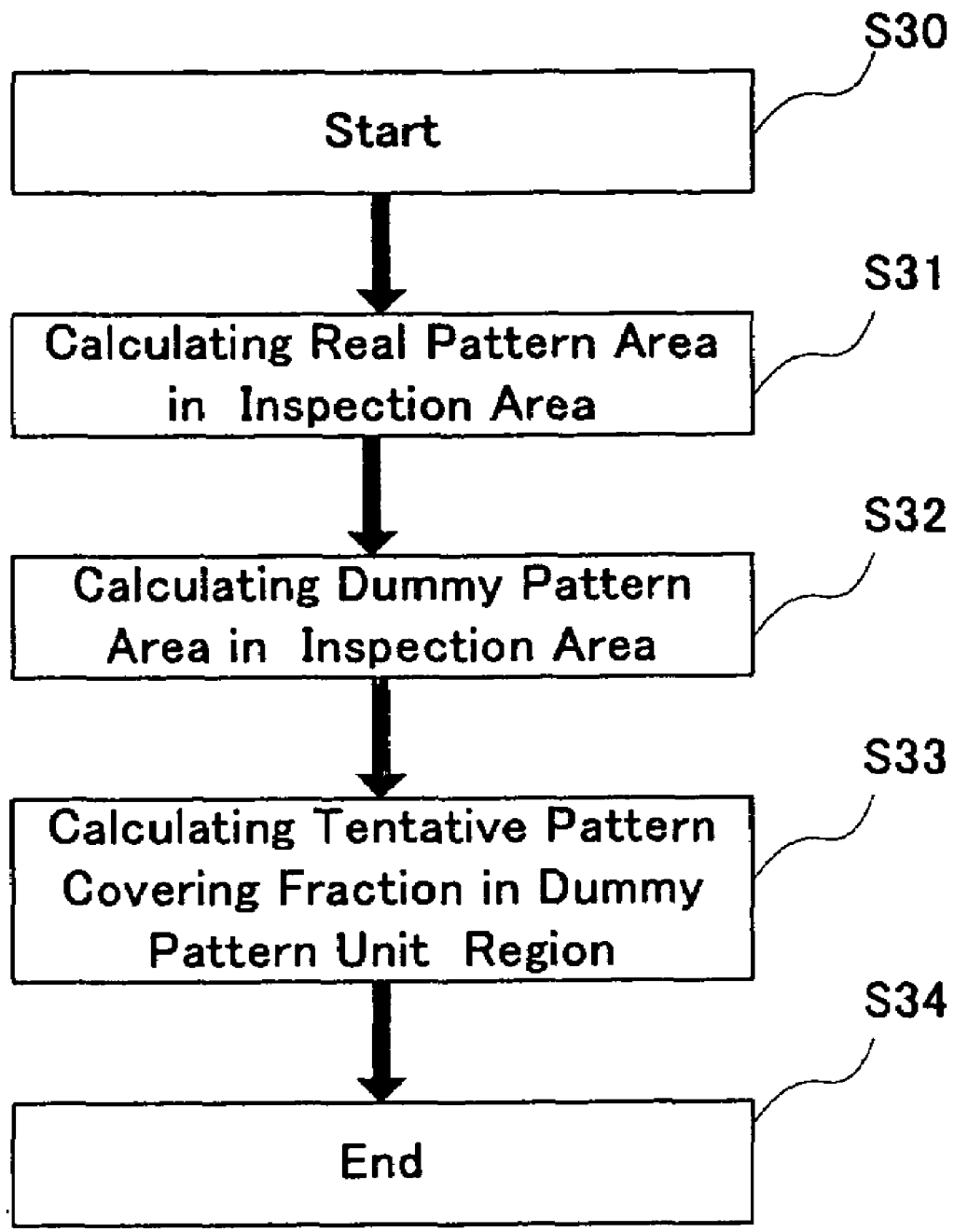
FIG. 3 shows a flow chart showing the pattern design method of the semiconductor device according to the first embodiment of the present invention.

The specific steps for calculating the tentative pattern-covering fraction are herein illustrated in a flowchart in FIG. 3. First of all, a total area of the actual patterns in the corresponding inspection area is calculated (S31). For example, since no actual pattern is included in the first inspection area 15, the tentative pattern-covering fraction is zero. On the other hand, the actual patterns are included in each of the second inspection area 16 and the third inspection area 17.

Next, the CPU 51 subtracts the total area of the actual patterns of each inspection area calculated in the previous S31 from a total area of the patterns of each inspection area derived from a predetermined average pattern-covering fraction, which is preset as a target with respect to the entire surface of the gate electrode layer 10, thereby calculating a total area of the dummy patterns of each inspection area (S32). For example, since no actual pattern is included in the first inspection area 15, the total area of the patterns of the inspection area is directly estimated as the total area of the dummy patterns of the first inspection area 15.

Furthermore, the tentative pattern-covering fraction of each dummy pattern unit region in the inspection area is calculated to allocate the total area of the dummy patterns of each inspection area to the dummy pattern unit regions 14 in the inspection area on an average (S33). The calculation of the tentative pattern-covering fraction of each dummy pattern unit region of the inspection area is ended by the aforementioned steps (S34). Additionally, the calculated tentative pattern-covering fraction of each dummy pattern unit region is stored in, for example, the RAM 53.

Backing to FIG. 2, for example, after the aforementioned steps are ended in connection with the first inspection area 15, the same steps are performed in connection with the second inspection area 16 and the third inspection area 17, sequentially. Then, the tentative pattern-covering fraction of each dummy pattern unit region 14 in the corresponding inspection area is calculated in connection with all inspection areas (S16 and S17).

Next, the final pattern-covering fraction of the dummy pattern unit region 14 is calculated. For example, the dummy pattern unit region 14a is included in each of the first inspection area 15, the second inspection area 16, and the third inspection area 17. Accordingly, there are three tentative pattern-covering fractions in connection with the dummy pattern unit region 14a. Moreover, when the total area of the actual patterns and the area of dummy pattern prohibition region 13 differ from one inspection area to another, the tentative pattern-covering fraction of the dummy pattern unit region differs from one inspection area to another. Accordingly, the CPU 51 reads data of the tentative pattern-covering fractions stored in the RAM 53 and calculates an average of the tentative pattern-covering fractions of the overlapping dummy pattern unit regions 14a in the respective inspection areas, thereby determining the final pattern-covering fraction (S18).

The calculation of the final pattern-covering fraction is executed on all dummy pattern unit regions 14 (S19). The calculated final pattern-covering fraction is stored in, for example, the RAM 53.

Figure 8:
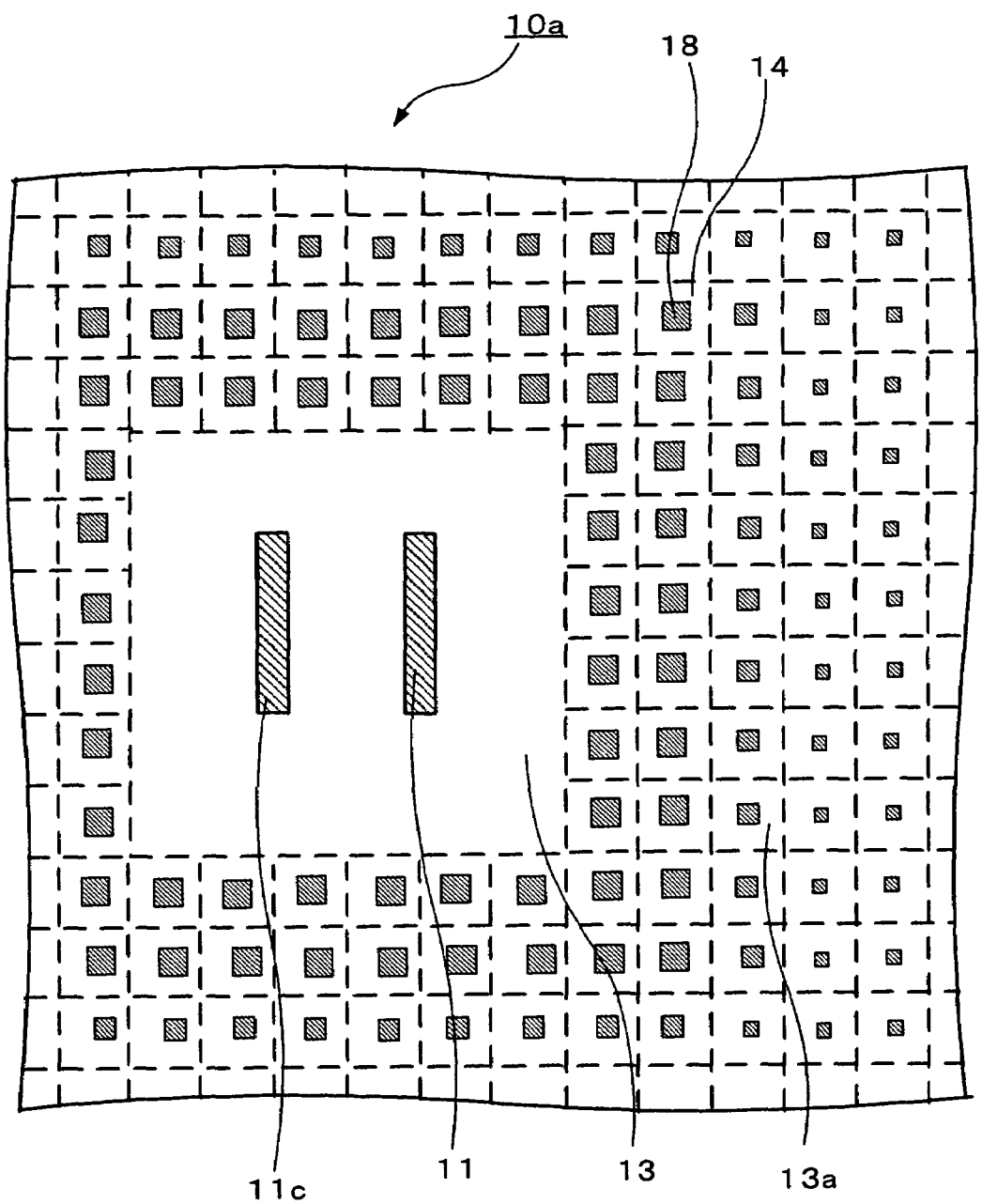
FIG. 8 shows a plane view showing the pattern design method of the semiconductor device according to the first embodiment of the present invention.

Sequentially, as illustrated in FIG. 8, a dummy pattern 18 is generated in the dummy pattern unit region 14 based on the final pattern-covering fraction obtained in S18 (S20). First of all, the final pattern-covering fraction stored in, for example, the RAM 53 is read by the CPU 51 for each dummy pattern unit region, and the CPU 51 determines a shape of the dummy pattern 18 in the dummy pattern unit region 14 based on the final pattern-covering fraction. The dummy pattern 18 is formed, for example, into a square shape. It may be possible, of course, to form other shapes such as a rectangle. Data including the dummy pattern 18 is added as a mask pattern for the gate electrode layer 10a (S21) and the pattern design for the gate electrode layer 10a is ended (S22). Furthermore, a pattern design for a mask layer other than the gate electrode layer 10a is carried out, if necessary.

As is seen from FIG. 8, the shape of the dummy pattern 18 in the vicinity of the dummy pattern prohibition region 13 is large, and the pattern-covering fraction of each dummy pattern unit region is relatively large. On the other hand, the shape of the dummy pattern 18 becomes small to converge to a fixed value as the distance from the gate electrodes 11 is increased, and the pattern-covering fraction of each dummy pattern unit region is relatively small. This allows precise control of the dummy pattern covering fraction in the vicinity of the pattern prohibition region, thus making it possible to carry out the pattern (including the dummy pattern) design having a pattern-covering fraction with a high uniformity as a whole.

According to the pattern design method of the aforementioned first embodiment, the pattern-covering fraction can be precisely controlled for each area determined by a pattern design apparatus, the large dummy pattern is formed in the vicinity of the dummy pattern prohibition region that surrounds the pattern region of the gate electrodes or the like, and the small dummy pattern is formed to converge to a fixed value as the distance from the dummy pattern prohibition region is increased. This makes it possible to carry out the pattern design having a pattern-covering fraction with a high uniformity as a whole. Accordingly, it is possible to prevent generation of non-uniformity in a semiconductor chip or semiconductor substrate, for example, a loading effect in the semiconductor device manufacturing process and improve the yield of semiconductor devices to be manufactured.

SECOND EMBODIMENT

In a second embodiment, an explanation will be given of a method of designing a mask pattern with a dummy pattern taking an example of the gate electrode layer in the integrated circuit using MOSFETs as semiconductor devices, similar to the first embodiment. In the present embodiment, an explanation will be given of a case in which the area of the inspection area is changed according to roughness and fineness of the element pattern.

The pattern design apparatus used in implementing the present embodiment is basically the same as that illustrated in FIG. 1 therefore the description is omitted.

Figure 9:
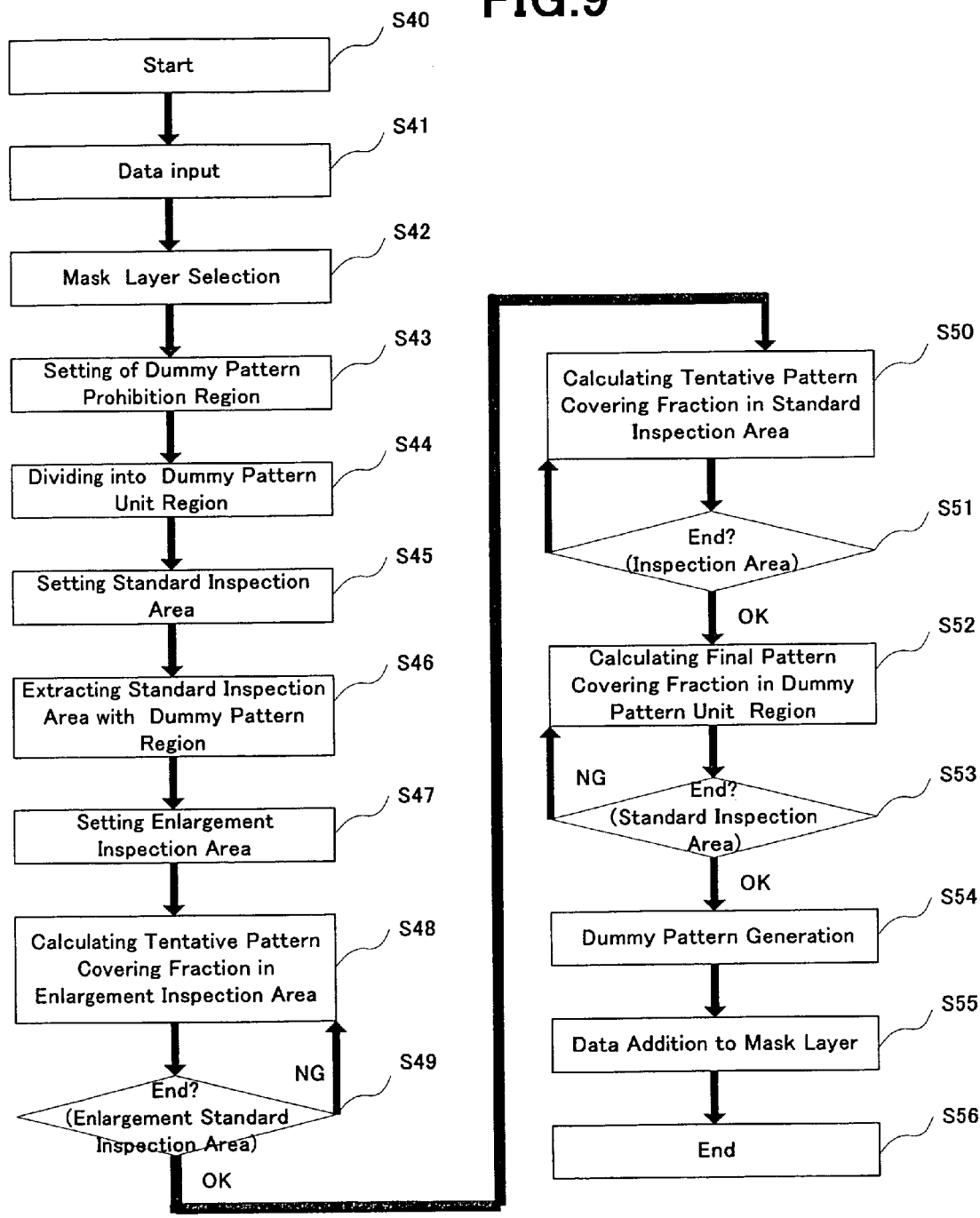
FIG. 9 shows a flow chart showing a pattern design method of a semiconductor device according to a second embodiment of the present invention.

FIG. 9 is a flowchart illustrating the steps of pattern design according to the present embodiment. In the present embodiment, after the operation is started (S40), deign data obtained when element layout design in the integrated circuit is ended is input into the storing portion such as the disk 60 of the pattern design apparatus which is basically the same as that used in the first embodiment (S41).

Sequentially, under control of the CPU 51, data input into the pattern design apparatus is read from the storing portion and displayed on the display portion 58, and a mask layer to which the dummy pattern is inserted is selected by the input portion 57 (S42). In the present embodiment, the gate electrode layer in the MOS transistor is selected, similar to the first embodiment. The pattern in which the MOS transistor as an element is laid out after the element layout design in the integrated circuit is ended is basically the same as that of FIG. 3 and the explanation is omitted.

Figure 10:
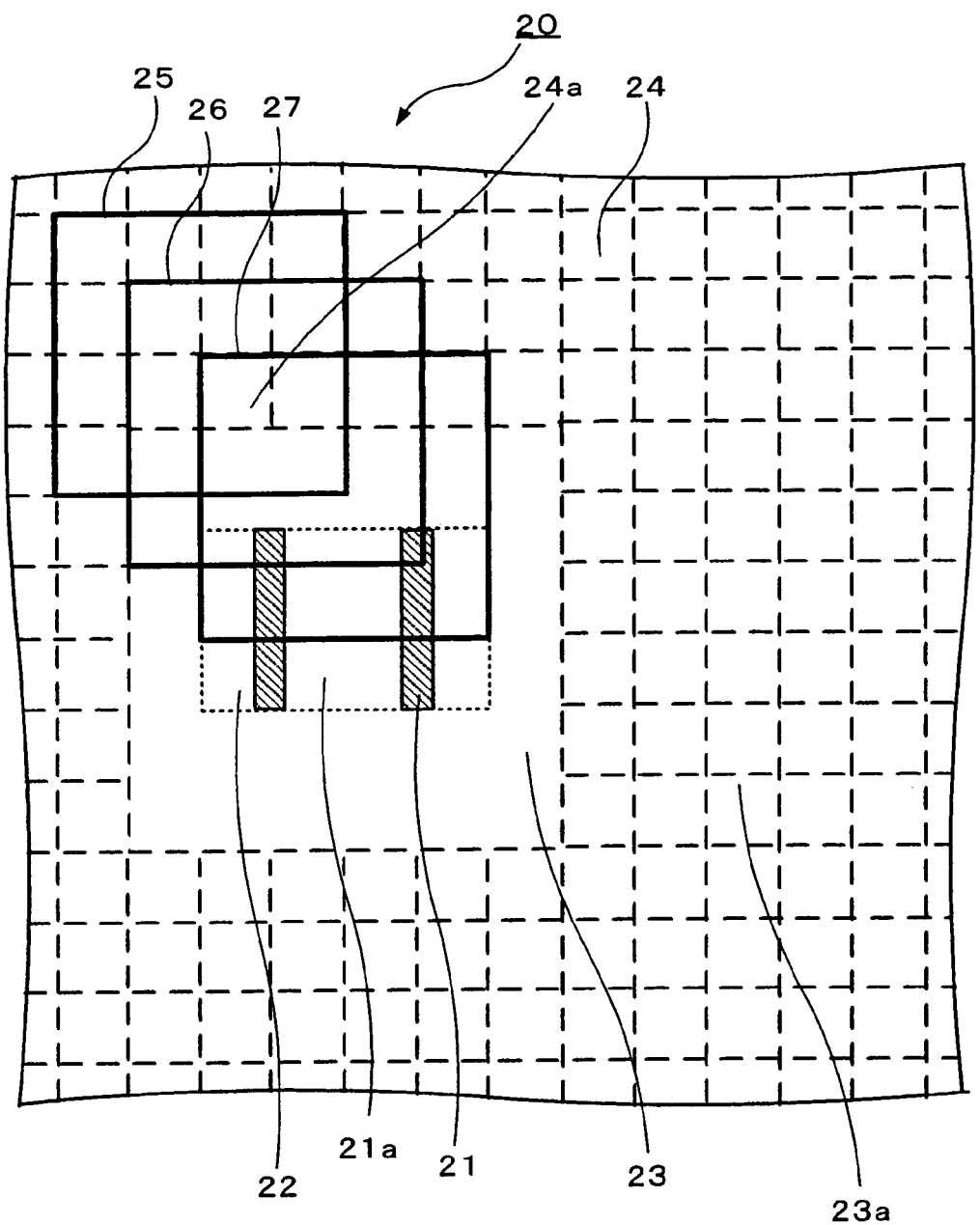
FIG. 10 shows a plane view showing the pattern design method of the semiconductor device according to the second embodiment of the present invention.

Next, as in a schematic plan view of a gate electrode layer 20 illustrated in FIG. 10, in the pattern design method of the present embodiment, in order to avoid interaction between the element and the dummy pattern, the CPU 51 controls the pattern design apparatus based on the pattern design program 53a so that a dummy pattern prohibition region 23 is formed to keep a predetermined distance from a MOS transistor region 22 and to surround the MOS transistor region 22, and a region other than the dummy pattern prohibition region 23 is a dummy pattern region 23a (S43).

Next, the CPU 51 divides the dummy pattern region 23a, that is the region excepting the dummy pattern prohibition region 23 with the gate electrode 21 formed in the gate electrode layer 20, into a plurality of dummy pattern unit regions 24 (S44). Though the dummy pattern unit regions 24 basically have the same shape, e.g., squares, and the same area, different shapes and areas may be included therein. As described later, a dummy pattern is formed in the dummy pattern unit region 24.

Sequentially, the CPU 51 determines standard inspection areas 25 to 27 that surround multiple dummy pattern unit regions 24 as illustrated in FIG. 10 (S45). FIG. 10 illustrates only the first standard inspection area 25, the second standard inspection area 26 and the third standard inspection area 27 as the example of the inspection areas. These standard inspection areas are, however, overlapped with one another and extend to the entire surface of the gate electrode layer 20 as shown by the first standard inspection area 25, the second standard inspection area 26 and the third standard inspection area 27.

Moreover, as illustrated by the first standard inspection area 25, the standard inspection area covers the multiple dummy pattern unit regions 24, and includes, for example, a part of the dummy pattern prohibition region 23 in some cases. While, for example, a dummy pattern unit region 24a is covered with each of the first standard inspection area 25, the second standard inspection area 26, and the third standard inspection area 27.

Figure 11:
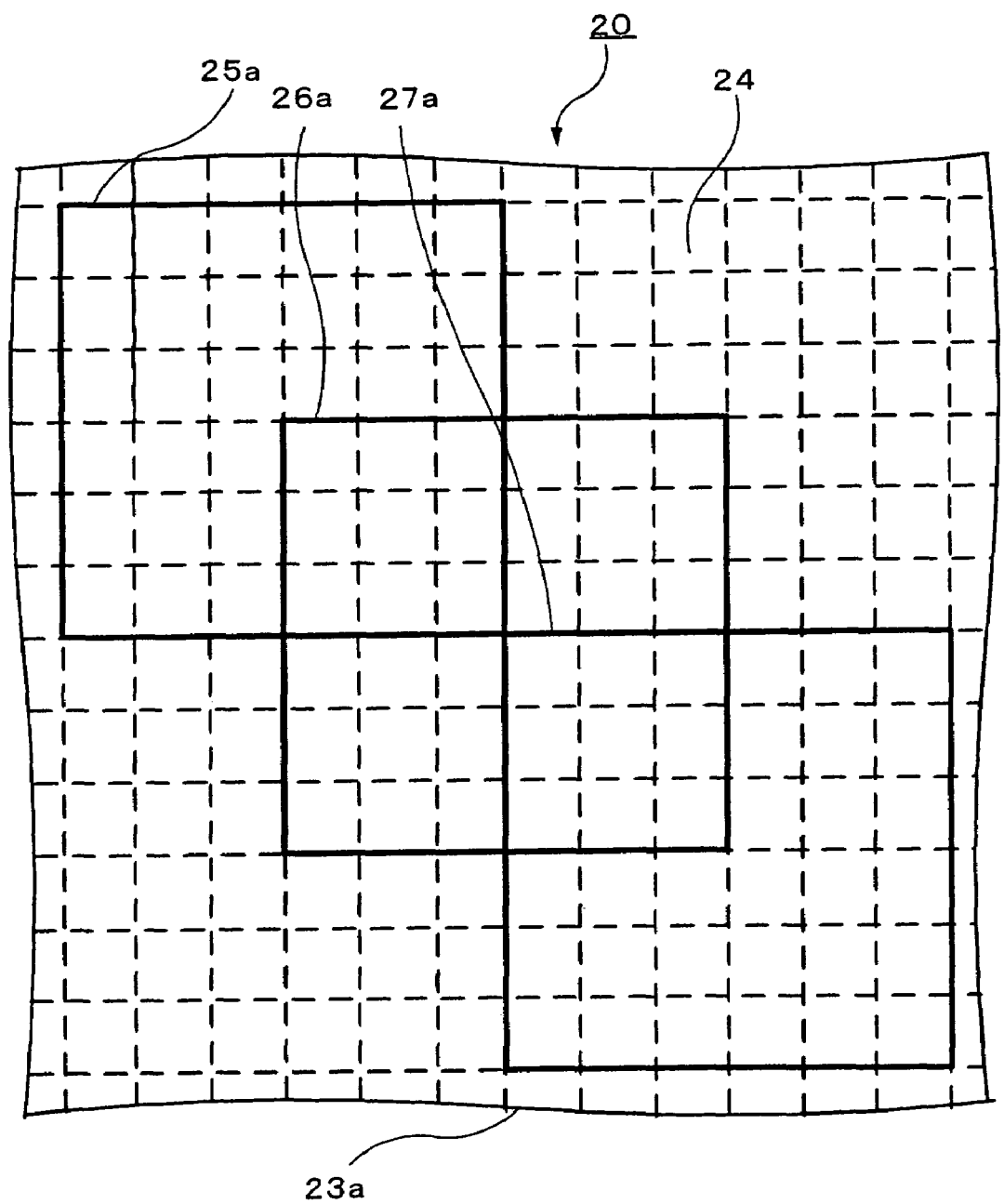
FIG. 11 shows a plane view showing the pattern design method of the semiconductor device according to the second embodiment of the present invention.

Next, in the present embodiment, the CPU 51 extracts only the standard inspection area, which does not include the dummy pattern prohibition area 23, from the standard inspection areas (S46). FIG. 11 is a plan schematic view illustrating a part of the region where no dummy pattern prohibition region 23 is included in the gate electrode layer 20. In the case where the inspection area is only the dummy pattern region 23a, since no actual pattern is included therein, the calculation of the area of the dummy pattern can be simply performed.

Accordingly, the CPU 51 determines enlargement inspection areas 25a to 27a which are larger than, for example, the standard inspection areas (S47), and reduces the rate of the area where the enlargement inspection areas 25a to 27a are overlapped with one another to calculate the tentative pattern-covering fraction of each dummy pattern unit region (S48). The calculation of the tentative pattern-covering fraction of each dummy pattern unit region of each of the enlargement inspection areas 25a to 27a is repeated until the calculations of all enlargement inspection areas are ended (S49).

Next, the CPU 51 calculates the tentative pattern-covering fraction, which is the pattern-covering fraction of the dummy pattern unit region 24 in the corresponding standard inspection area for each of the residual standard inspection areas that are not extracted in S46 (S50). The calculation of the tentative pattern-covering fraction is repeated until the calculations of all standard inspection areas are ended (S51). Additionally, the calculated tentative pattern-covering fraction is stored in, for example, the RAM 53.

The specific steps for calculating the tentative pattern-covering fraction are herein the same as those illustrated by the flowchart in FIG. 2 and the explanation is omitted herein.

For example, after the aforementioned steps are performed in connection with the first standard inspection area 25, the CPU 51 performs the same steps in connection with the second standard inspection area 26 and the third standard inspection area 27, sequentially. Then, the CPU 51 calculates the tentative pattern-covering fraction of the dummy pattern unit region 24 in the corresponding standard inspection area in connection with all standard inspection areas (S50 and S51).

Next, the CPU 51 calculates the final pattern-covering fraction of the dummy pattern unit region 24. For example, the dummy pattern unit region 24a is included in each of the first standard inspection area 25, the second standard inspection area 26, and the third standard inspection area 27. Accordingly, there are three tentative pattern-covering fractions in connection with the dummy pattern unit region 24a. Moreover, when the total area of the actual patterns and the area of dummy pattern prohibition region differ from one standard inspection area to another, the tentative pattern-covering fraction of the dummy pattern unit region differs from one standard inspection area to another. Accordingly, the CPU 51 calculates an average of the tentative pattern-covering fractions of the overlapping dummy pattern unit regions 24a in the respective standard inspection areas, thereby determining the final pattern-covering fraction (S52).

The calculation of the final pattern-covering fraction is executed on all dummy pattern unit regions 24 (S53). Additionally, the calculated final pattern-covering fraction is stored in, for example, the RAM 53.

Figure 12:
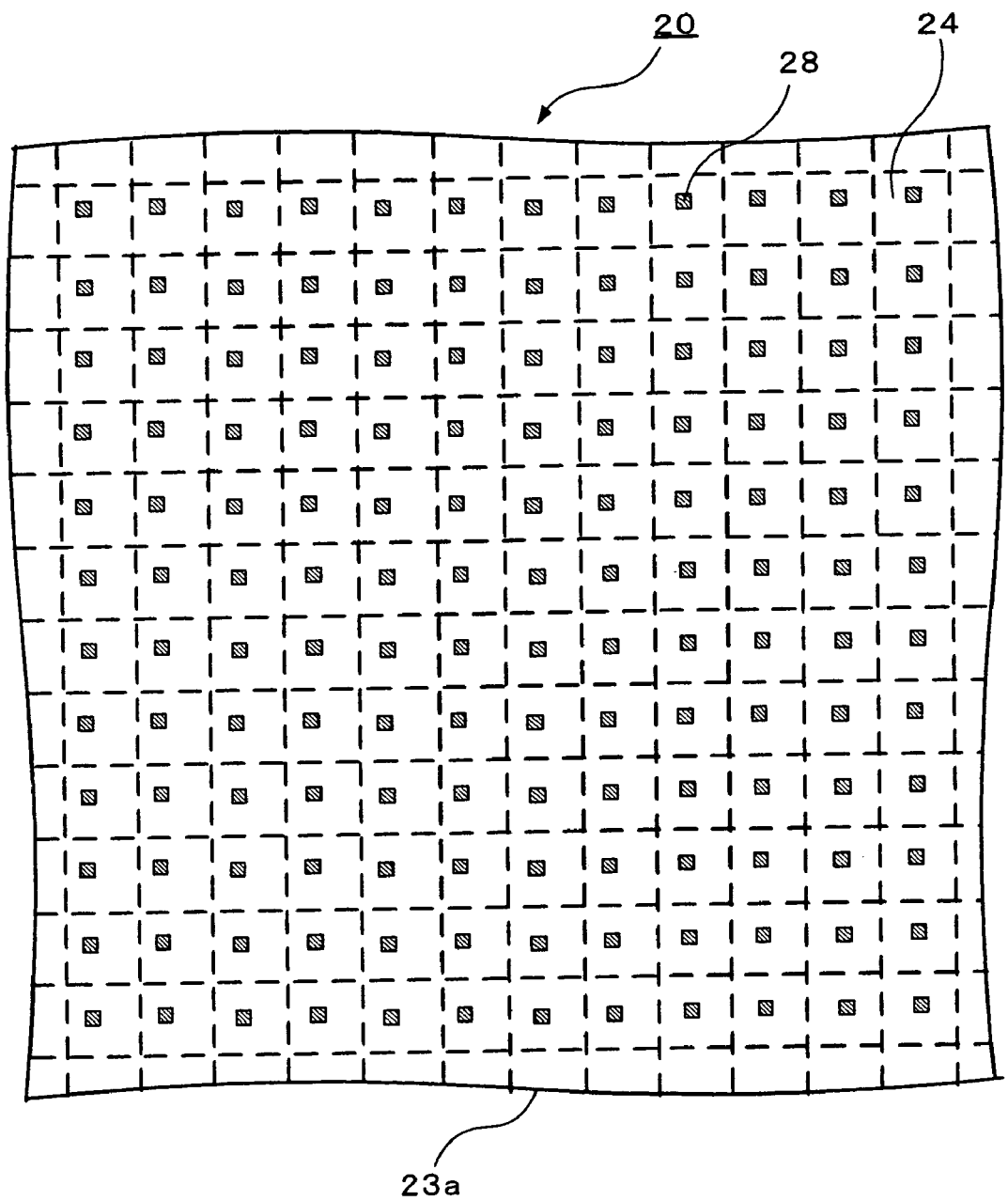
FIG. 12 shows a plane view showing the pattern design method of the semiconductor device according to the second embodiment of the present invention.

Sequentially, as illustrated in the schematic plan view of the gate electrode layer 20 including only the dummy pattern region 23a in FIG. 12, a dummy pattern 28 is generated in the dummy pattern unit region 24 based on the final pattern-covering fraction obtained in S52 (S54). First of all, the final pattern-covering fraction stored in, for example, the RAM 53 is read by the CPU 51 for each dummy pattern unit region, and the CPU 51 determines a shape of the dummy pattern 18 in the dummy pattern unit region 14 based on the final pattern-covering fraction. The dummy pattern 28 is formed, for example, into a square shape. It may be possible, of course, to form other shapes such as a rectangle. Data including the dummy pattern 28 is added as a mask pattern for the gate electrode layer 20 (S55) and the pattern design for the gate electrode layer 20 is ended (S56). Furthermore, a pattern design for a mask layer other than the gate electrode layer 20 is carried out, if necessary.

As is seen from FIG. 12, regarding the gate electrode layer 20 including only the dummy pattern region 23a, there are many areas where the same pattern is formed in each dummy pattern unit region. Accordingly, as in the present embodiment, since the use of the enlargement inspection regions allows a reduction in the number of inspection areas, calculation time can be shortened by the reduced number of inspection areas as compared with the first embodiment.

According to the aforementioned second embodiment, similar to the first embodiment, the pattern-covering fraction can be precisely controlled for each determined area, thus enabling to achieve the pattern design having a pattern-covering fraction with a high uniformity as a whole. This makes it possible to prevent generation of non-uniformity in a semiconductor chip or a semiconductor substrate, for example, a loading effect and the like in the semiconductor device manufacturing process and to improve the yield of semiconductor devices to be manufactured.

Moreover, away from the element design, the enlargement inspection area which is larger than the standard inspection area in the vicinity of the element region, is used instead of the inspection area of only the dummy pattern region, thereby making it possible to reduce the number of calculations of the pattern-covering fraction by the reduced number of inspection areas and to shorten the process.

THIRD EMBODIMENT

As a third embodiment of the present invention, FIGS. 13A to 13G illustrate a method of manufacturing a semiconductor device designed as a pattern, for example, as illustrated in FIG. 8.

Figure 13A:
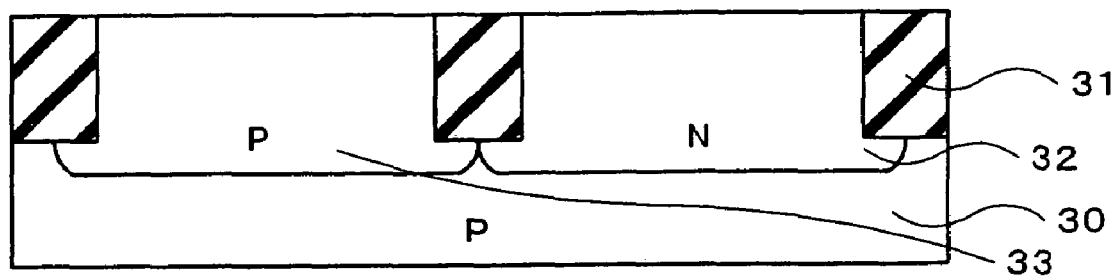

First of all, as illustrated in FIG. 13A, a p-type silicon substrate 30 is prepared as a semiconductor substrate, and an oxide film is selectively formed on the surface region by STI (Shallow Trench Isolation) to form an isolation region 31.

Next, phosphorus as an n-type impurity is introduced into a p-channel MISFET region in a region, which is selectively isolated by the isolation region 31 of the silicon substrate 30, using ion implantation, thereby forming an n-type well region 32. While, boron as a p-type impurity is introduced into an n-channel MISFET region using ion implantation, thereby forming a p-type well region 33. An amount of doses at this time is about $1E12$ $cm^{-2}$ to $1E13$ $cm^{-2}$ in each region. Thereafter, high-speed heating is performed, for example, at 900° C. for 10 sec., thereby activating the introduced n-type impurity and p-type impurity.

Figure 13B:
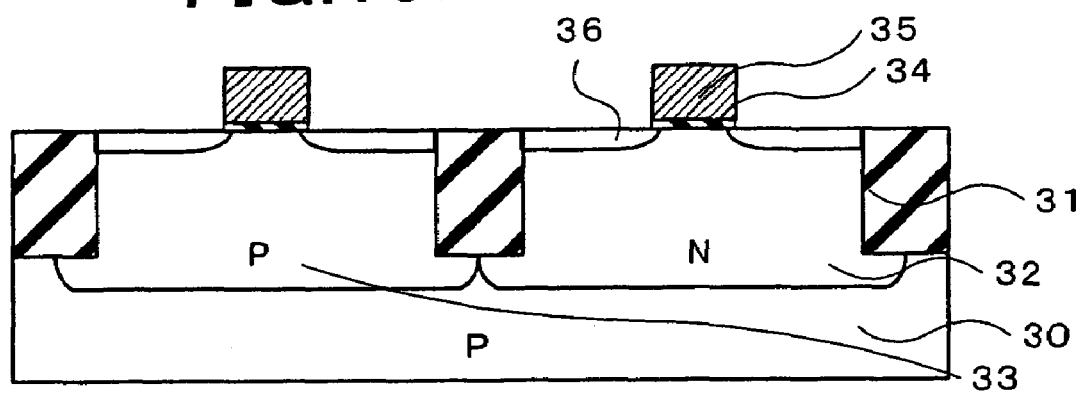

Sequentially, as illustrated in FIG. 13B, the surface of the silicon substrate 30 is thermally oxidized at 900° C. in oxygen atmosphere, thereby forming a thermal oxide film having a thickness of about 6 nm. After that, a polycrystalline silicon film of, for example, about 100 nm is formed by CVD.

Sequentially, these films are patterned using lithography, dry etching, etc., thereby forming a gate electrode film 35, made of the polycrystalline silicon film, and a gate insulating film 34 made of the thermal oxide film.

Furthermore, an extension region 36 is formed using the patterned gate electrode film 35 as a mask by ion implantation. Boron as a p-type impurity and arsenic as an n-type impurity are selectively introduced into the n-type well region 31 and the p-type well region 32 by using ion implantation. An amount of doses at this time is about $1E13$ $cm^{-2}$ to $1E15$ $cm^{-2}$ in each region. Thereafter, high-speed heating is performed, for example, at 900° C. for 10 sec., thereby activating the introduced p-type impurity and n-type impurity.

Additionally, there may be used a method in which the extension region 36 is formed by ion implantation without patterning the thermal oxide film, and thereafter the thermal oxide film is patterned to form the gate insulating film 34. Moreover, the thermal oxide film may be used as the gate insulating film 34 without being pattern.

Figure 13C:
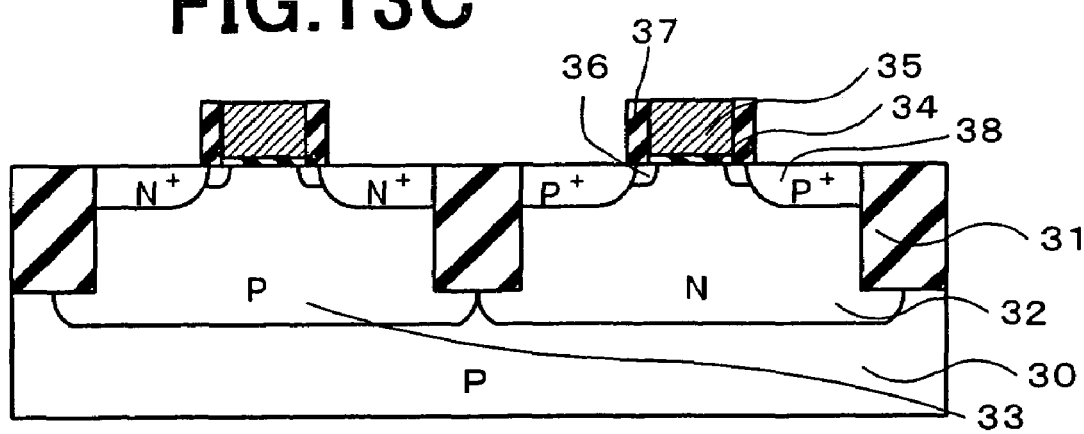

Next, a silicon nitride film of 20 to 40 nm is formed on the entire surface of the silicon substrate 30 by CVD, and thereafter anisotropic etching is performed by RIE, so that the silicon nitride film comes in contact with the gate electrode film 35 to be selectively left in the vicinity thereof, thereby forming a side-wall insulating film 37 as illustrated in FIG. 13C.

Sequentially, a source-drain region 38 is formed using the patterned gate electrode film 35 and the surrounding side-wall insulating film 37 there around as a mask by ion implantation. Namely, boron as a p-type impurity and arsenic as an n-type impurity are selectively introduced into the n-type well region 31 and the p-type well region 32 by using ion implantation. An amount of doses at this time is about $1E15$ $cm^{-2}$ to $1E16$ $cm^{-2}$ in each region. Thereafter, high-speed heating is performed, for example, at 900° C. for 10 sec., thereby activating the introduced p-type impurity and n-type impurity.

By use of the aforementioned processes indicated as an example, the element region having CMOS structure insulating gate field effect transistors is formed.

On the other hand, the region where the dummy pattern is formed is illustrated in FIG. 13D. The isolation region forming process and the gate electrode forming process are executed in the same way as the element region formation. Accordingly, there is formed a small-area dummy pattern 39 including the gate electrode film 35, which is the polycrystalline silicon film, and the side-wall insulating film 37, which is the silicon nitride film.

Moreover, the region including the dummy pattern prohibition region is illustrated in FIG. 13E. Since a dummy pattern prohibition area 39b exists, a large-area dummy pattern 39a is formed close thereto.

The following will explain the region illustrated in the aforementioned FIG. 13E using the plane pattern illustrated in FIG. 8. FIG. 13E corresponds to the gate electrodes 11, 11c, the dummy pattern prohibition region 13, and the portion close thereto. A relatively large-area dummy pattern is formed in the vicinity of the dummy pattern prohibition region 13, and a small-area dummy pattern is formed as the distance from the dummy pattern prohibition region 13 is increased. The region where the small-area dummy pattern is formed corresponds to FIG. 13D.

Figure 13F:
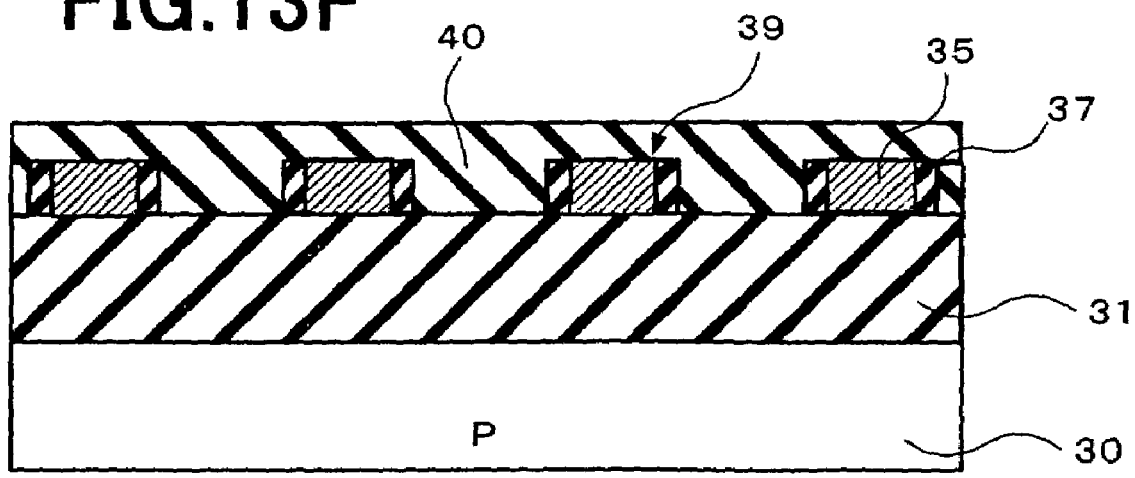
Figure 13G:
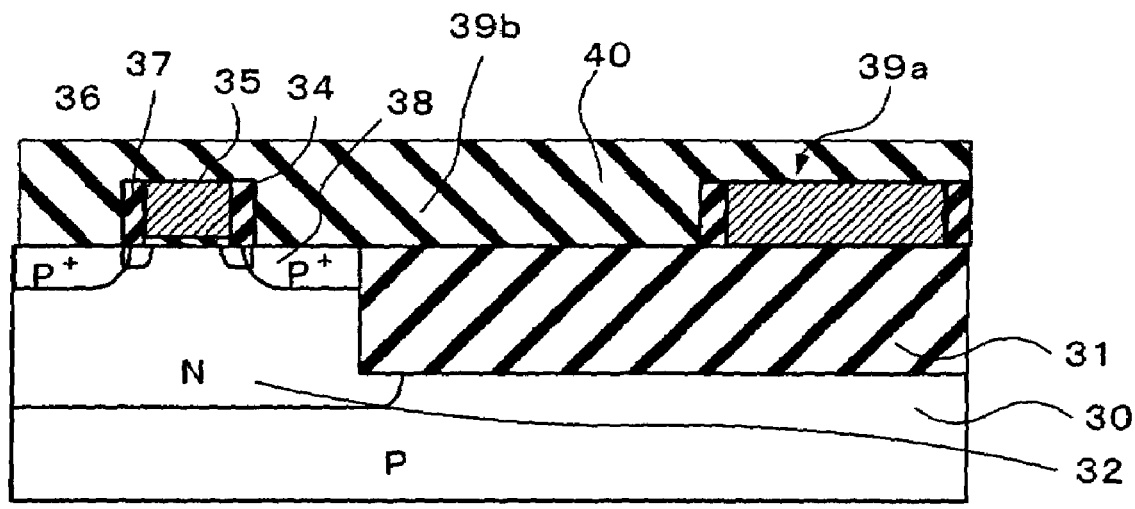

Sequentially, as illustrated in FIGS. 13F and 13G, an inter-layer insulating film such as a silicon oxide film or the like is formed. After that, the surface is planarized using CMP and the like (not shown).

Since roughness and fineness of the pattern-covering fraction in FIG. 13F and FIG. 13G can be relatively reduced by changing the area of the dummy pattern, satisfactory surface smoothness can be obtained.

Furthermore, the insulating film such as a silicon oxide film (not shown) is deposited on the entire surface of the silicon substrate 30, and thereafter the surface is planarized by thermal treatment, CMP, or the like. A contact hole is formed in the inter-layer insulating film, and there is formed a metal wiring, for example, a metal barrier wiring and an Al wiring, including the gate electrode of the n-channel MISFET, the source-drain region, the gate electrode of the p-channel MISFET, a connection between the source-drain regions. Moreover, the deposition of the inter-layer insulating film and the formation of the metal wiring are repeated as required, thereby forming a multilayer wiring. Sequentially, the entire surface of the silicon substrate 30 is covered with a passivation film for surface protection and a hole is formed in a pad portion, thereby completing the semiconductor device by the manufacturing method of the present embodiment.

The dummy pattern having a relatively large-area is formed in the vicinity of the dummy pattern prohibition region. The dummy pattern is formed to converge to a relatively small-area as the distance from the dummy pattern prohibition region is increased. As a result, roughness and fineness of the pattern-covering fraction is reduced to obtain the semiconductor device in which the inter-layer insulating film having satisfactory surface smoothness is formed.

Additionally, the present invention is not intended to be limited to the aforementioned embodiments. Various modifications may be made thereto without departing from the spirit and scope of the invention.

The area of the dummy pattern unit region can be variously changed depending on the elements such as accuracy of the pattern-covering fraction and the calculation time of the pattern design. Moreover, the size of the inspection area can be determined with consideration given to the covering fractions and the like of the element pattern and dummy pattern.

Furthermore, the dummy pattern is regularly arranged in the dummy pattern unit region on the embodiments for efficiency on executing the program. However, the regularity in the arrangement of the dummy pattern, such as setting the dummy pattern in the center of the dummy pattern unit region in FIG. 8,-may be not necessary.

The formation of the dummy pattern is effective for not only the mask pattern of the gate electrode layer but also the mask pattern of the wring layer including the multilayer wiring and the mask pattern of the element region.

Furthermore, the present invention is applicable to not only the semiconductor device using MOSFETs but also the semiconductor device including bipolar elements.

Moreover, the pattern design method can be used as one of the design methods in designing the mask pattern design, and can be dealt as an independent dummy pattern design tool.

What is claimed is:

1. A pattern design method of a semiconductor device, comprising:
    preparing design pattern data;
    separating a pattern region of a semiconductor device on the basis of the design pattern data into a dummy pattern region and a dummy pattern prohibition region;
    dividing the dummy pattern region into a plurality of dummy pattern unit regions;
    setting a plurality of inspection areas in the dummy pattern region and the dummy pattern prohibition region, the inspection area closing round at least the two or more dummy pattern unit regions, a part of one dummy pattern unit region overlapping a part of another dummy pattern unit region;
    calculating a tentative pattern-covering fraction of a dummy pattern, the dummy pattern being formed in the dummy pattern unit region of the inspection area;
    calculating a final pattern-covering fraction of the dummy pattern unit region, the final pattern-covering fraction being obtained by averaging the tentative pattern-covering fraction of the dummy pattern unit region in the inspection area; and
    generating the dummy pattern in the dummy pattern unit region on the basis of the final pattern-covering fraction calculated on the dummy pattern unit region.

2. The pattern design method of the semiconductor device according to claim 1, wherein calculating the tentative pattern-covering fraction includes calculating the dummy pattern area in the inspection area and calculating the tentative pattern-covering fraction of the dummy pattern unit region in the inspection area.

3. The pattern design method of the semiconductor device according to claim 1, wherein the pattern design method is performed on first mask layer having a gate electrode and a second mask layer having an element region in the semiconductor device.

4. The pattern design method of the semiconductor device according to claim 1, wherein an arrangement of the dummy pattern in the dummy pattern unit region has regularity.

5. The pattern design method of the semiconductor device according to claim 1, further comprising: setting an enlargement inspection area only having the dummy pattern region and calculating the tentative pattern-covering fraction in the enlargement inspection area between setting the plurality of the inspection areas and calculating the tentative pattern-covering fraction of the dummy pattern.

6. The pattern design method of the semiconductor device according to claim 5, wherein calculating the tentative pattern-covering fraction includes calculating the dummy pattern area in the inspection area and calculating the tentative pattern-covering fraction of the dummy pattern unit region in the inspection area.

7. The pattern design method of the semiconductor device according to claim 5, wherein the pattern design method is performed on a first mask layer having a gate electrode and a second mask layer having an element region in the semiconductor device.

8. The pattern design method of the semiconductor device according to claim 5, wherein an arrangement of the dummy pattern in the dummy pattern has regularity.

9. A program for a pattern design of a semiconductor device, comprising:
    preparing design pattern data;
    separating a pattern region of a semiconductor device on the basis of the design pattern data into a dummy pattern region and a dummy pattern prohibition region;
    dividing the dummy pattern region into a plurality of dummy pattern unit regions;
    setting a plurality of inspection areas in the dummy pattern region and the dummy pattern prohibition region, the inspection area closing round at least the two or more dummy pattern unit regions, a part of the one dummy pattern unit region overlapping a part of another dummy pattern unit region;
    calculating a tentative pattern-covering fraction of a dummy pattern, the dummy pattern being formed of the dummy pattern unit region in the inspection area;
    calculating a final pattern-covering fraction of the dummy pattern unit region, the final pattern-covering fraction being obtained by averaging the tentative pattern-covering fraction of the dummy pattern unit region in the inspection area; and
    generating the dummy pattern in the dummy pattern unit region on the basis of the final pattern-covering fraction calculated on the dummy pattern unit region.

10. The program for the pattern design of the semiconductor device according to claim 9, wherein calculating the tentative pattern-covering fraction includes calculating the dummy pattern area in the inspection area and calculating the tentative pattern-covering fraction of the dummy pattern unit region in the inspection area.

11. The program for the pattern design of the semiconductor device according to claim 9, wherein the pattern design method is performed on a first mask layer having a gate electrode and a second mask layer having an element region in the semiconductor device.

12. The program for the pattern design of the semiconductor device according to claim 9, wherein an arrangement of the dummy pattern in the dummy pattern unit region has regularity.

13. The program for the pattern design of the semiconductor device according to claim 9, further comprising setting an enlargement inspection area only having the dummy pattern region and calculating the tentative pattern-covering fraction in the enlargement inspection area between setting the plurality of the inspection areas and calculating the tentative pattern-covering fraction of the dummy pattern.

14. The program for the pattern design of the semiconductor device according to claim 13, wherein calculating the tentative pattern-covering fraction includes calculating the dummy pattern area in the inspection area and calculating the tentative pattern-covering fraction of the dummy pattern unit region in the inspection area.

15. The program for the pattern design of the semiconductor device according to claim 13, wherein the pattern design method is performed on a first mask layer having a gate electrode and a second mask layer having an element region in the semiconductor device.

16. The program for the pattern design of the semiconductor device according to claim 13, wherein an arrangement of the dummy pattern in the dummy pattern unit region has regularity.

* * * * *